United States Patent
Kang

(10) Patent No.: US 10,042,588 B2
(45) Date of Patent: Aug. 7, 2018

(54) ELECTRONIC DEVICE AND OPERATING METHOD THEREOF

(71) Applicant: SK hynix Inc., Icheon-si (KR)

(72) Inventor: Jae-Yong Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/467,374

(22) Filed: Mar. 23, 2017

(65) Prior Publication Data
US 2018/0018134 A1    Jan. 18, 2018

(30) Foreign Application Priority Data

Jul. 12, 2016 (KR) ........................ 10-2016-0088088

(51) Int. Cl.
*G11C 11/56*      (2006.01)
*G06F 3/06*       (2006.01)
*G11C 13/00*      (2006.01)

(52) U.S. Cl.
CPC .......... *G06F 3/0659* (2013.01); *G06F 3/0604* (2013.01); *G06F 3/0679* (2013.01); *G11C 13/0004* (2013.01); *G11C 13/0007* (2013.01); *G11C 13/0069* (2013.01)

(58) Field of Classification Search
CPC .... G06F 3/0659; G06F 3/0604; G06F 3/0679; G11C 13/0004; G11C 13/0007; G11C 13/0069

USPC ......................................................... 365/158
See application file for complete search history.

(56) References Cited

U.S. PATENT DOCUMENTS

| | | | |
|---|---|---|---|
| 8,922,235 B2 | 12/2014 | Ku et al. | |
| 9,437,289 B2 | 9/2016 | Oh et al. | |
| 2015/0049536 A1* | 2/2015 | Oh | G11C 13/003 365/148 |
| 2015/0380086 A1* | 12/2015 | Park | G11C 13/0069 365/148 |
| 2017/0206124 A1* | 7/2017 | Lim | G06F 11/0727 |
| 2017/0256320 A1* | 9/2017 | Lang | G11C 16/26 |

* cited by examiner

*Primary Examiner* — Richard Elms
*Assistant Examiner* — Xiaochun L Chen
(74) *Attorney, Agent, or Firm* — Perkins Coie LLP

(57) ABSTRACT

Disclosed is an operating method of an electronic device which includes a semiconductor memory having a plurality of resistive storage cells. The operating method may include: writing data to the resistive storage cells using a write current of a set condition; determining whether the writing of data to the resistive storage cells is successful, wherein the writing of data is determined to be failed when the number of resistive storage cells with failed writing of data exceeds a reference value, and successful when the number of resistive storage cells with failed writing of data is equal to or less than the reference value; strengthening the set condition when the writing of data is determined to be failed; and easing the set condition when the writing of data is determined to be successful.

17 Claims, 11 Drawing Sheets

US 10,042,588 B2

ELECTRONIC DEVICE AND OPERATING METHOD THEREOF

CROSS-REFERENCE TO RELATED APPLICATIONS

This patent document claims priority of Korean Patent Application No. 10-2016-0088088, entitled "ELECTRONIC DEVICE AND OPERATING METHOD FOR ELECTRONIC DEVICE" and filed on Jul. 12, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

Various embodiments are directed to an electronic device capable of increasing a margin using an optimized write current.

In one aspect, there is provided an operating method of an electronic device which includes a semiconductor memory having a plurality of resistive storage cells. The operating method may include: writing data to the resistive storage cells using a write current of a set condition; determining whether the writing of data to the resistive storage cells is successful, wherein the writing of data is determined to be failed when the number of resistive storage cells with failed writing of data exceeds a reference value, and successful when the number of resistive storage cells with failed writing of data is equal to or less than the reference value; strengthening the set condition when the writing of data is determined to be failed; and easing the set condition when the writing of data is determined to be successful.

In some implementations, the operating method may further include: repeating the writing of data, the determining step, the strengthening or easing the set condition.

In some implementations, the operating method may further include, after the repeating: storing a resultant set condition as an optimum condition.

In some implementations, the operating method may further include, after the storing of the optimum condition, performing a write operation using the write current determined under the optimum condition.

In some implementations, the set condition of a previous operation cycle may be stored during a current operation cycle.

In some implementations, the strengthening of the set condition may include increasing a pulse width of the write current, or an amount of the write current, or the both of the pulse width and the amount of the write current.

In some implementations, the easing of the set condition may include decreasing a pulse width of the write current, or an amount of the write current, or the both of the pulse width and amount of the write current.

In some implementations, the semiconductor memory may include: one or more bit lines each coupled to a corresponding resistive storage cell among the plurality of resistive storage cells; one or more source lines each coupled to a corresponding resistive storage cell among the plurality of resistive storage cells; and one or more word lines each coupled to a corresponding resistive storage cell among the plurality of resistive storage cells.

In some implementations, when the set condition is changed, the period in which a write voltage is applied between the one or more bit lines and the one or more source lines may be adjusted in order to control the pulse width of the write current.

In some implementations, when the set condition is changed, the level of a write voltage applied between the one or more bit lines and the one or more source lines, or a level of an active voltage applied to the word line, or the level of the write voltage and the level of the active voltage may be adjusted to increase the amount of the write current.

In some implementations, when the set condition is changed, the level of a write voltage applied between the one or more bit lines and source lines may be lowered, the level of an active voltage applied to the word line may be lowered, or the level of the write voltage and the level of the active voltage may be lowered, in order to decrease the amount of the write current.

In some implementations, the operating method may further include resetting the plurality of resistive storage cells.

In another aspect, an electronic device may include a semiconductor memory. The semiconductor memory may include a plurality of resistive storage cells, each operable to store data and to receive a writing current to write data; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control a pulse width or an amount of a write current flowing through a resistive storage cell among the plurality of resistive storage cells, according to the set condition.

The electronic device may further include an optimum condition storage unit configured to store the set information corresponding to the set condition of a current write operation as optimum condition information, when the previous write operation is determined as the fail and the current write operation is determined as the pass, and store the set information corresponding to the set condition of the previous write operation as the optimum condition information, when the previous write operation is determined as the pass and the current write operation is determined as the fail.

The set information generation unit may store the set information corresponding to the set condition of the previous write operation, until the current write operation is completed.

The write current generation unit may generate a write current using the optimum condition information stored in the optimum condition storage unit, in order to perform a write operation.

As the set condition is strengthened, the write current generation unit may increase the pulse width of the write current, increases the amount of the write current, or increase the pulse width and amount of the write current.

As the set condition is strengthened, the write current generation unit may increase a value corresponding to the product of the pulse width and the current amount.

As the set condition is eased, the write current generation unit may decrease the pulse width of the write current, decrease the amount of the write current, or decrease the pulse width and amount of the write current.

As the set condition is eased, the write current generation unit may decrease a value corresponding to the product of the pulse width and the current amount.

The semiconductor memory may further include: one or more bit lines each coupled to one end of a corresponding resistive storage cell among the plurality of resistive storage cells; one or more source lines each coupled to the other end of a corresponding resistive storage cell among the plurality of resistive storage cells; and one or more word lines each coupled to a corresponding resistive storage cell among the plurality of resistive storage cells.

The write current generation unit may increase the period in which a write voltage is applied between the one or more bit lines and source lines when the pulse width of the write current is increased, and decrease the period in which the write voltage is applied between the one or more bit lines and source lines when the pulse width of the write current is decreased.

When the amount of the write current is increased, the write current generation unit may raise the level of a write voltage applied between the one or more bit lines and source lines, raise the level of an active voltage applied to the word line, or raise the level of the write voltage and the level of the active voltage.

When the amount of the write current is decreased, the write current generation unit may lower the level of a write voltage applied between the one or more bit lines and source lines, lower the level of an active voltage applied to the word line, or lower the level of the write voltage and the level of the active voltage.

The variable resistance element may include one or more of structures each having a metal oxide layer and a tunnel barrier layer interposed between two magnetic layers.

The electronic device may further include a microprocessor. The microprocessor may include a control unit for receiving a signal having a command from an outside of the microprocessor, extracting or decoding the command, or performing input/output control of the signal of the microprocessor; an operation unit for performing an operation according to a decoding result of the command in the control unit; and a storage unit for storing data to be operated, data corresponding to an operation result, or an address of the data to be operated. The semiconductor memory may be a part of the storage unit within the microprocessor.

The electronic device may further include a processor. The processor may include a core unit for performing an operation corresponding to a command using data according to the command input from an outside of the processor; a cache memory unit for storing data to be operated, data corresponding to an operation result, or an address of the data to be operated; and a bus interface which is coupled between the core unit and the cache memory unit, and transfers data between the core unit and the cache memory unit. The semiconductor memory may be a part of the cache memory unit within the processor.

The electronic device may further include a processing system. The processing system may include a processor for interpreting a received command, and controlling an operation of information according to an interpreting result of the command; an auxiliary memory device for storing a program for interpreting the command and the information; a main memory device for importing and storing the program and the information from the auxiliary memory device such that the processor may perform the operation using the program and the information when the program is executed; and an interface device for performing communication between one or more of the processor, the auxiliary memory device and the main memory device and an outside. The semiconductor memory may be a part of the auxiliary memory device or the main memory device within the processing system.

The electronic device may further include a data storage system. The data storage system may include a storage device for storing data and retaining the stored data regardless of a power supply; a controller for controlling data input/output of the storage device according to a command input from an outside; a temporary storage device for temporarily storing the data which is exchanged between the storage device and the outside; and an interface for performing communication between one or more of the storage device, the controller and the temporary storage device and the outside. The semiconductor memory may be a part of the storage device or the temporary storage device within the data storage system.

The electronic device may further include a memory system. The memory system may include a memory for storing data and retaining the stored data regardless of a power supply; a memory controller for controlling data input/output of the memory according to a command input from an outside; a buffer memory for buffering the data which is exchanged between the memory and the outside; and an interface for performing communication between one or more of the memory, the memory controller and the buffer memory and the outside. The semiconductor memory may be a part of the memory or the buffer memory within the memory system.

DETAILED DESCRIPTION

Figure 1:
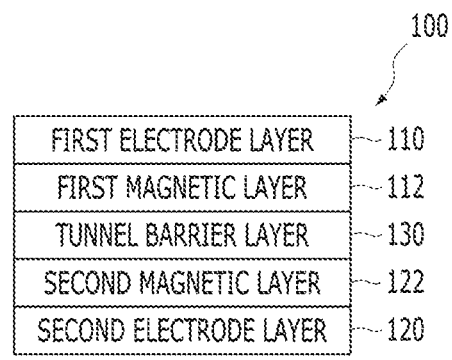
FIG. 1 illustrates an MTJ (Magnetic Tunnel Junction) structure having a tunnel barrier layer interposed between two magnetic layers.

Various embodiments will be described below in more detail with reference to the accompanying drawings. Throughout the disclosure, like reference numerals refer to like parts throughout the various figures and embodiments of the disclosed technology.

A semiconductor device in accordance with an embodiment may include a variable resistance element that exhibits different resistance states with different resistance values for storing data. Hereafter, the variable resistance element may have a variable resistance characteristic, and include a single-layer or multilayer structure. For example, the variable resistance element may include a material used in RRAM, PRAM, MRAM or FRAM, for example, a chalcogenide-based compound, transition metal compound, ferroelectric substance or ferromagnetic substance. However, the present embodiment is not limited thereto, but the variable resistance element may include various materials as long as they have a variable resistance characteristic of switching between different resistance states according to a voltage or current applied across the variable resistance element.

In some implementations, the variable resistance element may include a metal oxide. The metal oxide may include a transition metal oxide such as nickel (Ni) oxide, titanium (Ti) oxide, hafnium (Hf) oxide, zirconium (Zr) oxide, tungsten (W) oxide or cobalt (Co) oxide and a perovskite-based material such as STO (SrTiO) or PCMO (PSCaMnO). Such a variable resistance element may have a characteristic of switching between different resistance states through formation/disappearance of a current filament according to the behavior of vacancies.

In some implementations, the variable resistance element may include a phase change material. The phase change material may include a chalcogenide-based material such as GST (Ge—Sb—Tb), for example. The variable resistance element may switch between different resistance states while being stabilized to any one of a crystalline state and an amorphous state by heat.

In some implementations, the variable resistance element may include a structure having a tunnel barrier layer interposed between two magnetic layers. The magnetic layers may be formed or include a material such as NiFeCo or CoFe, and the tunnel barrier layer may be formed of or include a material such as $Al_2O_3$. Such a variable resistance element may have a characteristic of switching between different resistance states according to the magnetization directions of the magnetic layers. For example, the variable resistance element may have a low-resistance state when the magnetization directions of the two magnetic layers are parallel to each other, or have a high-resistance state when the magnetization directions of the two magnetic layers are anti-parallel to each other.

FIG. 1 illustrates an MTJ (Magnetic Tunnel Junction) structure having a tunnel barrier layer interposed between two magnetic layers.

As illustrated in FIG. 1, the MTJ 100 may include a first electrode layer 110 serving as a top electrode, a second electrode layer 120 serving as a bottom electrode, a pair of magnetic layers including a first magnetic layer 112 and a second magnetic layer 122, and a tunnel barrier layer 130 formed between the pair of magnetic layers 112 and 122.

In some implementations, the first magnetic layer 112 may include a free ferromagnetic layer of which the magnetization direction is varied according to the direction of a current applied to the MTJ 100, and the second magnetic layer 122 may include a pinned ferromagnetic layer of the magnetization direction is pinned.

The resistance state of the MTJ 100 varies with the relative direction of the first magnetic layer 112 with respect to the second magnetic layer 122 to exhibit different resistance values depending on the relative direction of the magnetizations of the layers 112 and 122. Such different resistance states can be used to represent different data, e.g., data "0" or "1". In addition, the resistance state and the corresponding resistance value of the MJT 100 can be changed by the current that is directed through the MTJ 100 based on the direction of the current when the amplitude of the current is at or above a threshold current that is sufficient to alter the relative magnetization direction between the two layers 112 and 122.

Figure 2A:
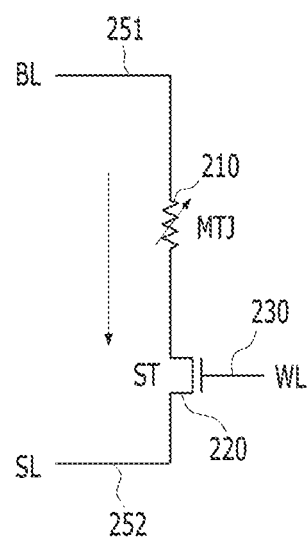
FIGS. 2A and 2B are diagrams for describing an operation that data is stored in a variable resistance element.
Figure 2B:
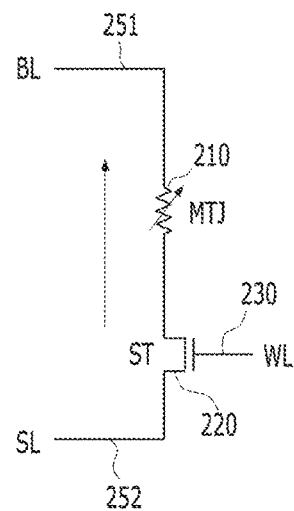

FIGS. 2A and 2B are diagrams describing operations for storing data in a variable resistance element 210. In some implementations, the MTJ 100 described with reference to FIG. 1 may operate as the variable resistance element 210.

FIG. 2A is a diagram describing the operation of storing data having a 'low' logic value in the variable resistance element 210. In a memory with an array of variable resistance elements 210, the variable resistance element 210 in which data is to be stored may be selected by enabling a word line 230 coupled to the variable resistance element 210 and turning on a transistor 220 as a switching element that activates or deactivates the variable resistance element 210. When a current flows from a first end 251 toward a second end 252, that is, from the first electrode layer 110 serving as the top electrode of the MTJ 100 toward the second electrode layer 120 (the bottom electrode of the MTJ 100, as shown by the arrow direction in FIG. 2A, the variable resistance element 210 may have a low resistance state. In this case, the magnetization direction of the first magnetic layer 112 (a free ferromagnetic layer) becomes parallel to the magnetization direction of the second magnetic layer 122 (a pinned ferromagnetic layer). When the variable resistance element 210 has a low resistance state, it may be defined that 'low' data is stored in the variable resistance element 210.

FIG. 2B is a diagram describing the operation for storing data having a 'high' logic value in the variable resistance element 210. Similarly, the word line 230 coupled to the variable resistance element 210 may be enabled to turn on the transistor 220 to store data therein. When a current flows from the second end 252 toward the first end 251, that is, from the second electrode layer 120 toward the first electrode layer 110 as shown by the arrow direction in FIG. 2B, the variable resistance element 210 may have a high resistance state. In this case, the magnetization direction of the first magnetic layer 112 becomes anti-parallel to the magnetization direction of the second magnetic layer 122. When the variable resistance element 210 has a high resistance state, it may be defined that 'high' data is stored in the variable resistance element 210.

The logic value of the data stored in the variable resistance element 210 may be changed according to the resistance value of the variable resistance element 210. When the difference of the resistance values between the high resistance state and the low resistance state is large, it becomes easy to determine the data stored in the variable resistance element because the two different resistance states are readily distinguishable from each other. When the difference of the resistance values between the high resistance state and the low resistance state is small, it can be difficult to determine the data stored in the variable resistance element. Small difference of the resistance values between the two different states of the variable resistance element may cause an error in determining the data stored in the variable resistance element. Thus, there is a demand for a technology capable of precisely determining data stored in the variable resistance element even though the difference of resistance values between a high resistance state and a low resistance state of the variable resistance element is small.

Figure 3:
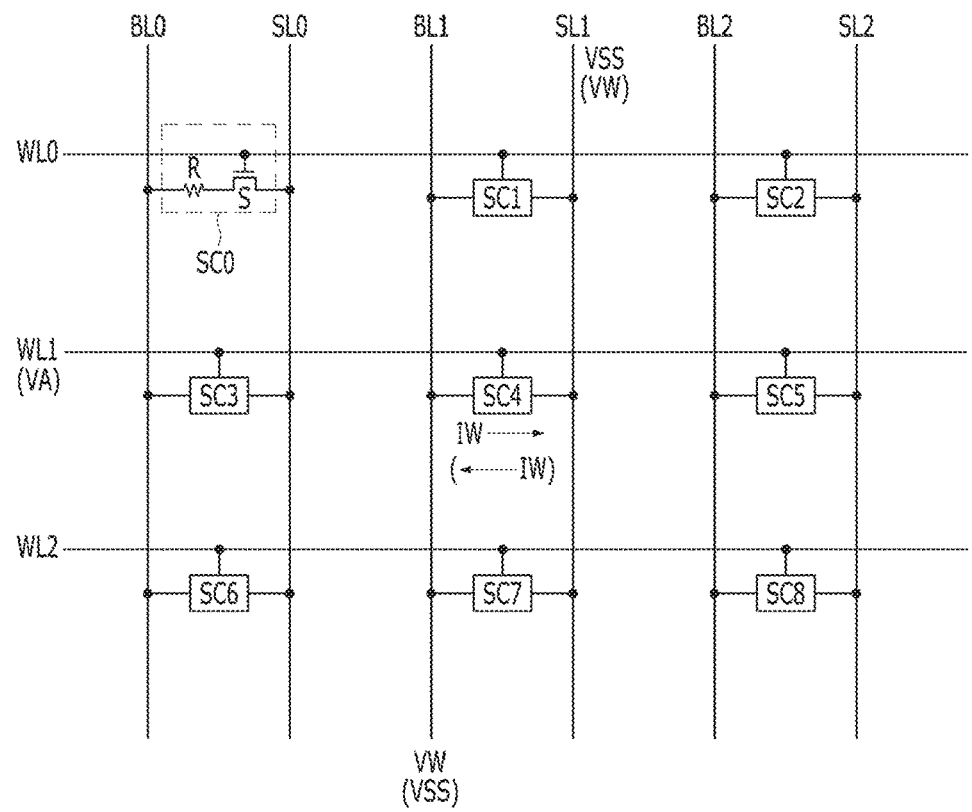
FIG. 3 is an exemplary configuration diagram of a cell array including resistive storage cells.

FIG. 3 is an exemplary configuration diagram of a cell array 300 including a plurality of resistive storage cells.

Referring to FIG. 3, the cell array 300 may include a plurality of resistive storage cells SC0 to SC8, a plurality of word lines WL0 to WL2, a plurality of bit lines BL0 to BL2 and a plurality of source lines SL0 to SL2.

Each of the resistive storage cells SC may be coupled between the corresponding bit line among the plurality of bit lines BL0 to BL2 and the corresponding source line among the plurality of source lines SL0 to SL2, and coupled to the corresponding word line among the plurality of word lines WL0 to WL2.

Each of the resistive storage cells SC may include a variable resistance element R and a selecting element S coupled in series to the variable resistance element R. The variable resistance element R may have a low resistance state when "low" data (for example, 0) is stored therein, or have a high resistance state when "high" data (for example, 1) is stored therein. On the other hand, the variable resistance element R may have a low resistance state when "high" data is stored therein, or have a high resistance state when "low" data is stored therein. In FIG. 3, the internal configuration of the resistive storage cell SC0 only is illustrated for convenience of illustration. Other resistive storage cells SC1 to SC8 may have the same internal configuration as the resistive storage cell SC0.

Hereafter, an operation of writing data in a resistive storage cell will be described. In the descriptions below, the resistive storage cell SC4 is selected to store data therein among the plurality of resistive storage cells SC0 to SC8.

When "low" data is to be written to the resistive storage cell SC4, a write voltage VW may be applied to one end of the bit line BL1, a ground voltage VSS may be applied to one end of the source line SL1, and an active voltage VA is applied to the word line WL1. In this case, a write current IW may flow from the one end of the bit line BL1 to the one end of the source line SL1. When "high" data is written to the resistive storage cell SC4, the write voltage VW may be applied to the one end of the source line SL1, the ground voltage VSS may be applied to the one end of the bit line BL1, and the active voltage VA is applied to the word line WL1. In this case, the write current IW may flow from the one end of the source line SL1 to the one end of the bit line BL1.

During a write operation, the amount of the write current IW and the period during which the write current IW is applied (hereafter, referred to as pulse width) may affect the accuracy of the write operation and current consumption of the write operation.

During a write operation, the amount or pulse width of the write current IW may be increased to improve reliability of the write operation of the resistive storage cell SC4. The increase of the amount or pulse width of the write current IW may prevent an abnormal operation of the resistive storage cell SC4. However, when the amount or pulse width of the write current IW exceeds a predetermined threshold value, the variable resistance element R included in the resistive storage cell SC4 may be irreversibly damaged. Thus, the amount and pulse width of the write current IW need to be increased within a range lower than the threshold value. When the amount and pulse width of the write current IW are increased, current consumption during the write operation may be increased. Thus, the write current IW may need to be determined to have optimum current amount and pulse width in consideration of the trade-off between the reliability of the write operation and the current consumption during the write operation.

For reference, FIG. 3 illustrates that the resistive storage cells are arranged in a 3×3 matrix. However, the resistive storage cells may be arranged in various manners, for example, including dozens to tens of thousands of rows and columns.

Figure 4:
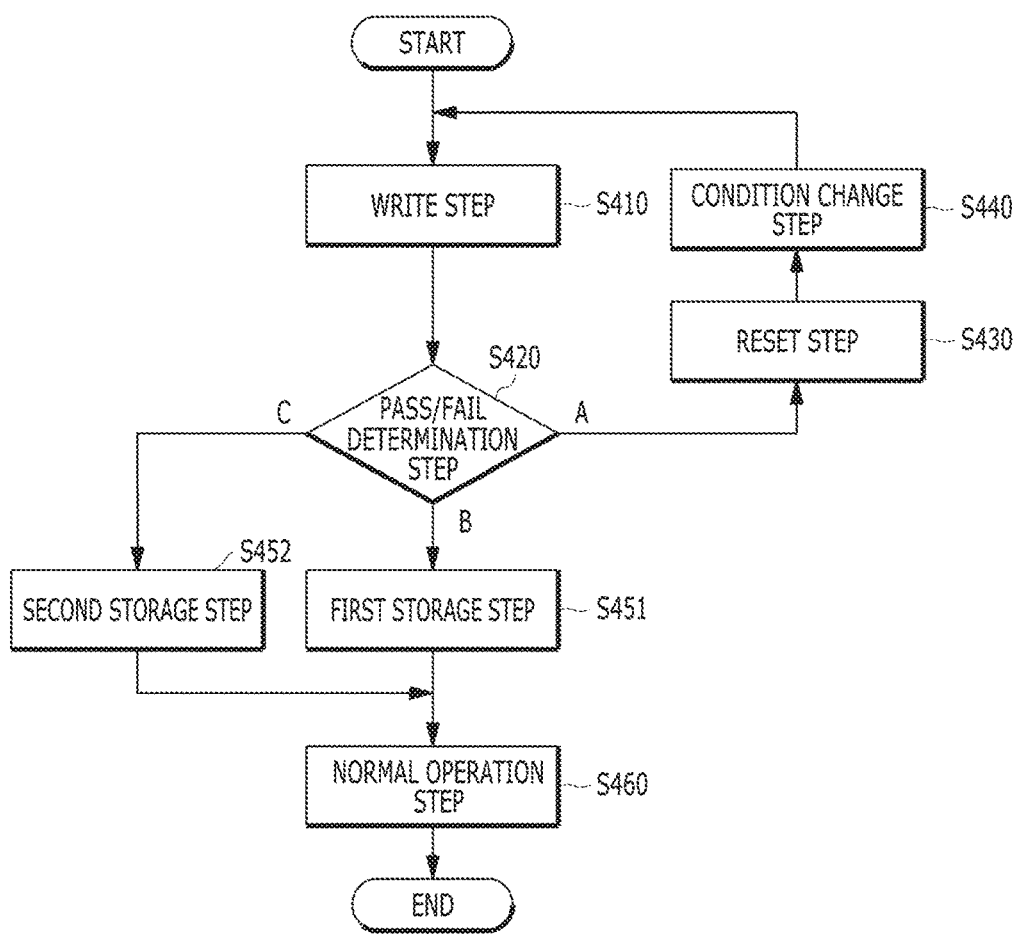
FIG. 4 is a flowchart for describing an exemplary operating method of an electronic device which includes a memory circuit (device) having variable resistance elements.

FIG. 4 is an exemplary flowchart describing an operation of an electronic device including a memory circuit (device) having variable resistance elements.

Referring to FIG. 4, the operating method of the electronic device may include a write step S410, a pass/fail determination step S420, a reset step S430, a condition change step S440, a storage step S451 and S452 and a normal operation step S460. The operations including the write step S410, the pass/fail determination step S420, the reset step S430, the condition change step S440 and a storage step S451 and S452 are performed to provide an optimum condition for a writing current IW.

Hereafter, referring to FIGS. 3 and 4, the operating method of the electronic device is described with additional details.

The memory circuit (device) may control a write current IW to have the amount and pulse width according to a set condition.

At the write step S410, the memory circuit may generate the write current IW according to the set condition, and write 'low' data or 'high' data to the plurality of resistive storage cells SC0 to SC8. Once specific data is written to the resistive storage cells SC0 to SC8, the write step S410 for a test cycle may be completed.

The write step S410 of the first test cycle may be performed under the condition referred to as an 'initial condition.' For reference, in the initial condition, the write current IW may have the amount and pulse width corresponding to middle values in the possible range of the amount and pulse width thereof. For example, when assuming that the amount of the write current IW is set in the range of Imin (minimum value) and Imax (maximum value) and the pulse width is set in the range of Wmin (minimum value) and Wmax (maximum value), under the initial condition, the amount of the write current IW is set to a value corresponding to (Imin+Imax)/2 and the pulse width of the write current IW is set to a value corresponding to (Wmin+Wmax)/2.

At the pass/fail determination step S420, the memory circuit may count the number of resistive storage cells among the plurality of resistive storage cells, in which data as desired is not stored. For example, the memory circuit may determine resistive storage cells, in which data as desired is not stored, through a read operation. Hereafter, the counted number of resistive storage cells that have failed in writing desired data will be referred to as the number of fail bits. When the number of fail bits exceeds a reference value, the memory circuit may determine the write operation S410 as a fail, and when the number of fail bits is equal to or less than the reference value, the memory circuit may determine the write operation S410 as a pass. Hence, when the number of fail bits exceeds the reference value, the memory circuit may determine that the write operation S410 has failed, and when the number of fail bits is equal to or less than the reference value, the memory circuit may determine that the write operation S410 is successful.

As shown in FIG. 4, the operating method proceeds from the pass/fail determination step S420 to the conditioning change step S430, the first storage step S451, or the second storage step S452 depending on the determination of the pass/fail determination step S420. Hereafter, a test cycle may be defined to include operations including the write step S410, the pass/fail determination step S420, the reset step S430, and the condition change step S440. After the rest step S4410 of the test cycle, the memory circuit may perform another test cycle by repeating the operations including the write step S410, the pass/fail determination step S420, the reset step S430, and the condition change step S440.

In the first test cycle, the memory circuit may proceed to the reset step S430 and the condition change step S440 through a first path A after the pass/fail determination step S420 regardless of the determination at the pass/fail determination step S420. In the second and subsequent test cycles, the pass/fail determination step S420 involves operations including (1) counting the number of resistive storage cells in which data as desired is not stored, (2) determining whether the write operation for the current test cycle is a fail or pass, and (3) comparing whether the determination for the current test cycle is the same as the determination for the previous test cycle.

In the second and subsequent test cycles, the memory circuit may proceed to the reset step S430 and the condition change step S440 through the first path A after the pass/fail determination step S420, when the pass/fail determination result for the current test cycle is same as the pass/fail determination result of the pass/fail determination step S420 for the previous test cycle. That is, when the determinations for the current test cycle and the previous test cycle indicate the same results, i.e., the both write operations have been determined as a fail or the both write operations have been determined as a pass, the memory circuit may proceed to the reset step S430 and the condition change step S440 through the first path A.

If the determination at the pass/fail determination step S420 for the current test cycle is different from the determination at the pass/fail determination step S420 for the previous test cycle, the memory circuit may proceed to a first storage step S451 or second storage step S452.

When the pass/fail determination step S420 of the previous test cycle has determined the write operation as a fail and the pass/fail determination step S420 of the current test cycle has determined the write operation as a pass (that is, the determination for the fail has been made earlier and the determination for the pass has been made later), the memory circuit may proceed to the first storage step S451 through a second path B. At the first storage step S451, the memory circuit may store the set condition used for generating the write current IW at the write step S410 of the current test cycle as the optimum condition.

When the pass/fail determination step S420 of the previous test cycle has been determined the write operation as a pass and the pass/fail determination step S420 of the current test cycle has been determined the write operation as a fail (that is, the determination for the pass has been made earlier and the determination for the fail has been made later), the memory circuit may proceed to the second storage step S451 through a third path C. At the second storage step S452, the memory circuit may store the set condition used for generating the write current IW at the write step S410 of the previous test cycle as the optimum condition.

At this time, in order to store the set condition of the previous test cycle at the second storage step S452, the set condition used for generating the write current W at the write step S410 of the previous test cycle may be stored during the current test cycle.

At the reset step S430, the memory circuit may reset data of the plurality of resistive storage cells SC0 to SC8 by writing data different from the data written at the write step S410 to the plurality of resistive storage cells SC0 to SC8, in order to reset the plurality of resistive storage cells SC0 to SC8. For example, when "high" data is written to the resistive storage cell SC0 at the write step S410, the memory circuit may write "low" data to reset the resistive storage cell SC0 at the reset step S430.

At the condition change step S440, the memory circuit may change a set condition for a write operation of the next test cycle according to the determination result of the pass/fail determination step S420. At the condition change step S440 reset step S430, the memory circuit may strengthen the set condition with regard to the current condition when the write operation was determined as a fail at the pass/fail determination step S420, or ease the set condition with regard to the current condition when the write operation was determined as a pass at the pass/fail determination step S420.

To strengthen the set condition, the amount and pulse width of the write current IW may be controlled as follows: (1) the amount of the write current IW may be increased while the pulse width of the write current IW is maintained. (2) Alternatively, the pulse width of the write current IW may be increased while the amount of the write current IW is maintained. (3) Alternatively, both of the amount and pulse width of the write current IW may be increased. (4)

Alternatively, the product of the write current IW and the pulse width may be increased.

On the other hand, to ease the set condition, the amount and pulse width of the write current IW may be controlled as follows: (1) the amount of the write current IW may be decreased while the pulse width of the write current IW is maintained. (2) Alternatively, the pulse width of the write current IW may be decreased while the amount of the write current IW is maintained. (3) Alternatively, both of the amount and pulse width of the write current IW may be decreased. (4) Alternatively, the product of the write current IW and the pulse width may be decreased.

When the condition change step S440 is completed, the memory circuit may proceed to the write step S410 to start the next test cycle. Such an operation may be repeated until the memory circuit proceeds to the first or second storage step S451 or S452.

When the first or second storage step S451 or S452 is completed, the test operation can be ended with the optimum condition information stored. At the normal operation step S460, the memory circuit may perform a write operation using the write current IW of which the amount and pulse width are set according to the optimum condition information stored through the test operation. Thus, the memory circuit can perform a write operation which is optimized in terms of reliability and current consumption.

Hereafter, a method which can be used to control the amount and pulse width of the write current IW will be described.

(1) Controlling the Amount of the Write Current IW

In order to control the amount of the write current IW, the level of the write voltage VW may be controlled. When the amount of the write current IW is increased, the level of the write voltage VW may be raised, and when the amount of write current IW is decreased, the level of the write voltage VW may be lowered.

Alternatively, in order to control the amount of write current IW, the level of the active voltage VA may be controlled. When the amount of write current IW is increased, the level of the active voltage VA may be raised, and when the amount of write current IW is decreased, the level of the active voltage VA may be lowered.

Alternatively, in order to control the amount of write current IW, the levels of the write voltage VW and the active voltage VA may be controlled together. When the amount of the write current IW is increased, the levels of the write current IW and the active voltage VA may be raised, and when the amount of write current IW is decreased, the levels of the write current IW and the active voltage VA may be lowered.

(2) Controlling the Pulse Width of the Write Current IW

In order to control the pulse width of the write current IW, the period during which the write voltage VW is applied may be controlled. When the pulse width of the write current IW is increased, the period during which the write voltage VW is applied may be increased, and when the pulse width of the write current IW is decreased, the period during which the write voltage VW is applied may be decreased.

Figure 5:
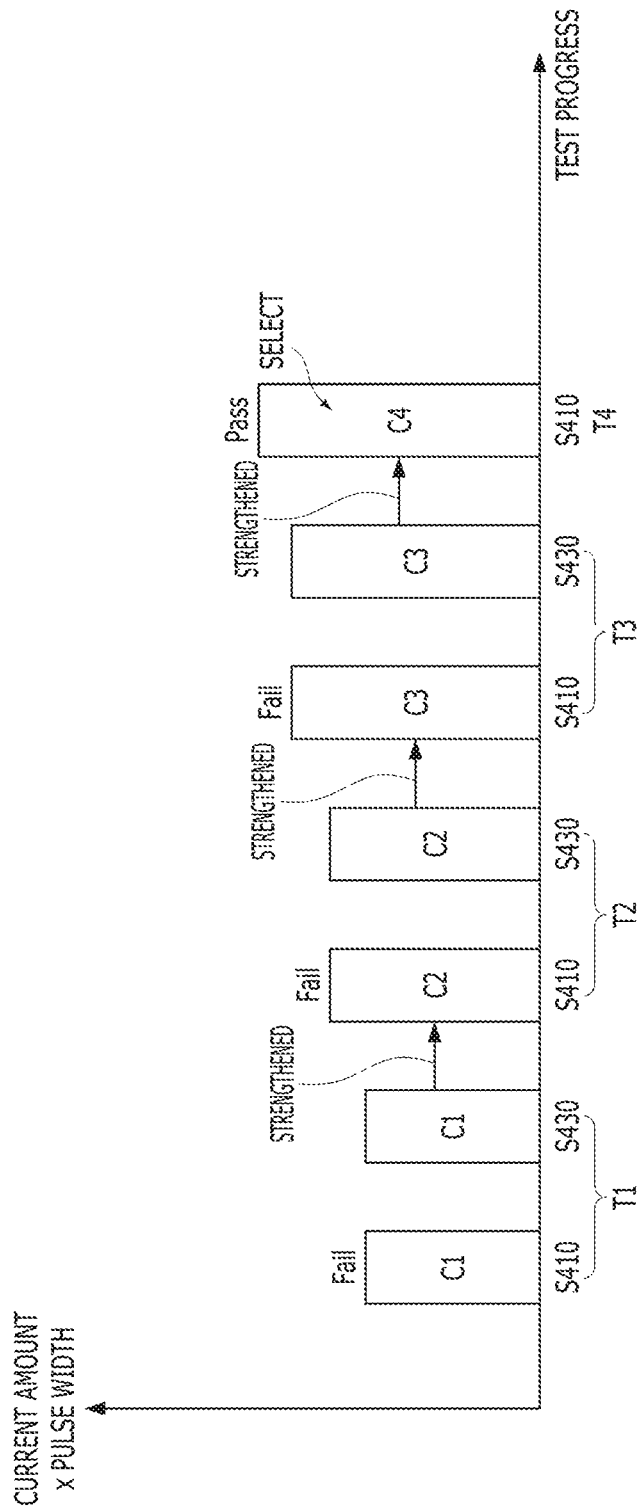
FIG. 5 is a diagram for describing an exemplary operating method of the electronic device when a write operation is determined as a fail at a pass/fail determination step of a first test cycle.

FIG. 5 is an exemplary diagram for describing the operating method of the electronic device. In an example shown in FIG. 5, the write operation for each of the first test cycle T1, the second test cycle T2, and the third test cycle T3 is determined as a fail at the pass/fail determination step S420 and the write operation for the fourth test cycle T4 is determined as a pass at the pass/fail determination step S420. In FIG. 5, the height of a bar graph may correspond to the product of the amount and the pulse width of the write current IW.

The first test cycle T1 may be performed under a first condition C1. At the write step S410 and the reset step S430, the memory circuit may perform a write operation and reset operation using a write current IW set according to the first condition C1. In the first test cycle T1, the memory circuit proceeds to the condition change step S440 regardless of the determination of the pass/fail determination step S420. Since the result of the write operation is determined as a fail, the memory circuit strengthen the set condition at the condition change step S440, for example, to a second condition C2 from the first condition C1. At the condition change step S440, data of each of the resistive storage cell is reset to have a value different from that previously stored in each of the resistive storage cell. As the condition change step S440 is completed, the first test cycle T1 has been finished. The memory circuit proceeds to the write step S410 for the second test cycle T2.

At the write step S410 and the reset step S430 of the second test cycle T2, the memory circuit may perform a write and reset operation using a write current IW corresponding to the second condition C2. When the result of the write operation is determined as a fail, the set condition may be strengthened to a third condition C3 from the second condition C2.

At the write step S410 and the reset step S430 condition change step S440 of the third test cycle T3, the memory circuit may perform a write and reset operation using a write current IW corresponding to the third condition C3. When the result of the write operation is determined as a fail, the set condition may be strengthened to a fourth condition C4 from the third condition C3.

At the write step S410 and the reset step S430 of the fourth test cycle T4, the memory circuit may perform a write and reset operation using a write current IW corresponding to the fourth condition C4. When the result of the write operation is determined as a pass, the fourth condition C4 may be stored as the optimum condition (SELECT).

Figure 6:
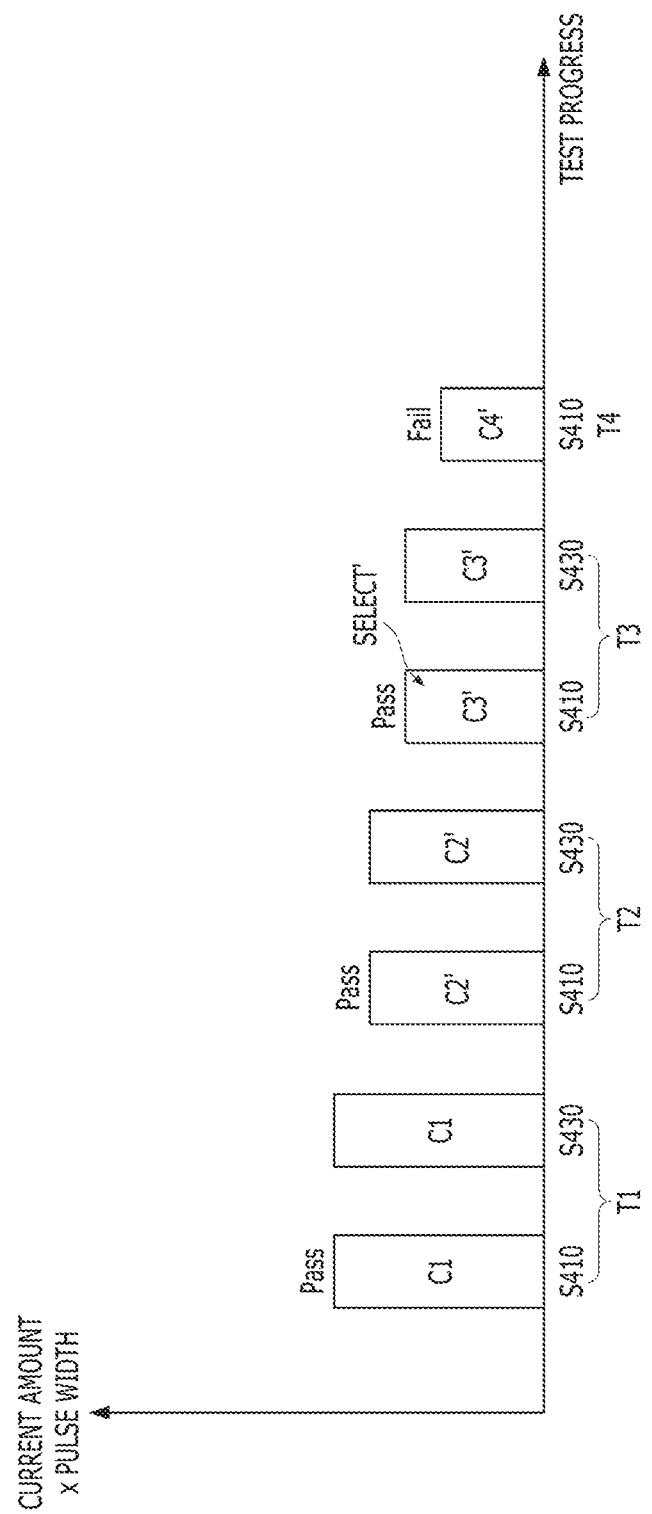
FIG. 6 is a diagram for describing an exemplary operating method of the electronic device when a write operation is determined as a pass at the pass/fail determination step of the first test cycle.

FIG. 6 is an exemplary diagram for describing the operating method of the electronic device. In an example shown in FIG. 6, the write operation for each of the first test cycle T1, the second test cycle T2, and the third test cycle T3 is determined as a pass at the pass/fail determination step S420 and the writing operation for the fourth test cycle T4 is determined as a fail at the pass/fail determination step S420. In FIG. 6, the height of a bar graph may correspond to the product of the amount and the pulse width of the write current IW.

The set condition of the first test cycle T1 may be set to a first condition C1. At the write step S410 and the reset step S430, the memory circuit may perform a write and reset operation using a write current IW corresponding to the first condition C1. When the result of the write operation is determined as a pass, the set condition may be eased to a second condition C2' from the first condition C1.

At the write step S410 and the reset step S430 of the second test cycle T2, the memory circuit may perform a write and reset operation using a write current IW corresponding to the second condition C2'. When the result of the write operation is determined as a pass, the set condition may be eased to a third condition C3' from the second condition C2'.

At the write step S410 and the reset step S430 of the third test cycle T3, the memory circuit may perform a write and reset operation using a write current IW corresponding to the third condition C3'. When the result of the write operation is determined as a pass, the set condition may be eased to a fourth condition C4' from the third condition C3'.

At the write step S410 and the reset step S430 of the fourth test cycle T4, the memory circuit may perform a write and reset operation using a write current IW corresponding to the fourth condition C4'. When the result of the write operation is determined as a fail, the third condition C3' may be stored as the optimum condition (SELECT').

The operating method of the electronic device may perform a test operation while gradually strengthening or easing the set condition according to the pass/fail determination result of the first test cycle. When the pass/fail determination result is changed, the operating method may store the set condition of the previous or current test cycle as the optimum condition in which the write operation can be optimized, such that the set condition is used during a normal operation. Therefore, the operating method can minimize current consumption while securing a margin for preventing an error during a write operation.

Figure 7:
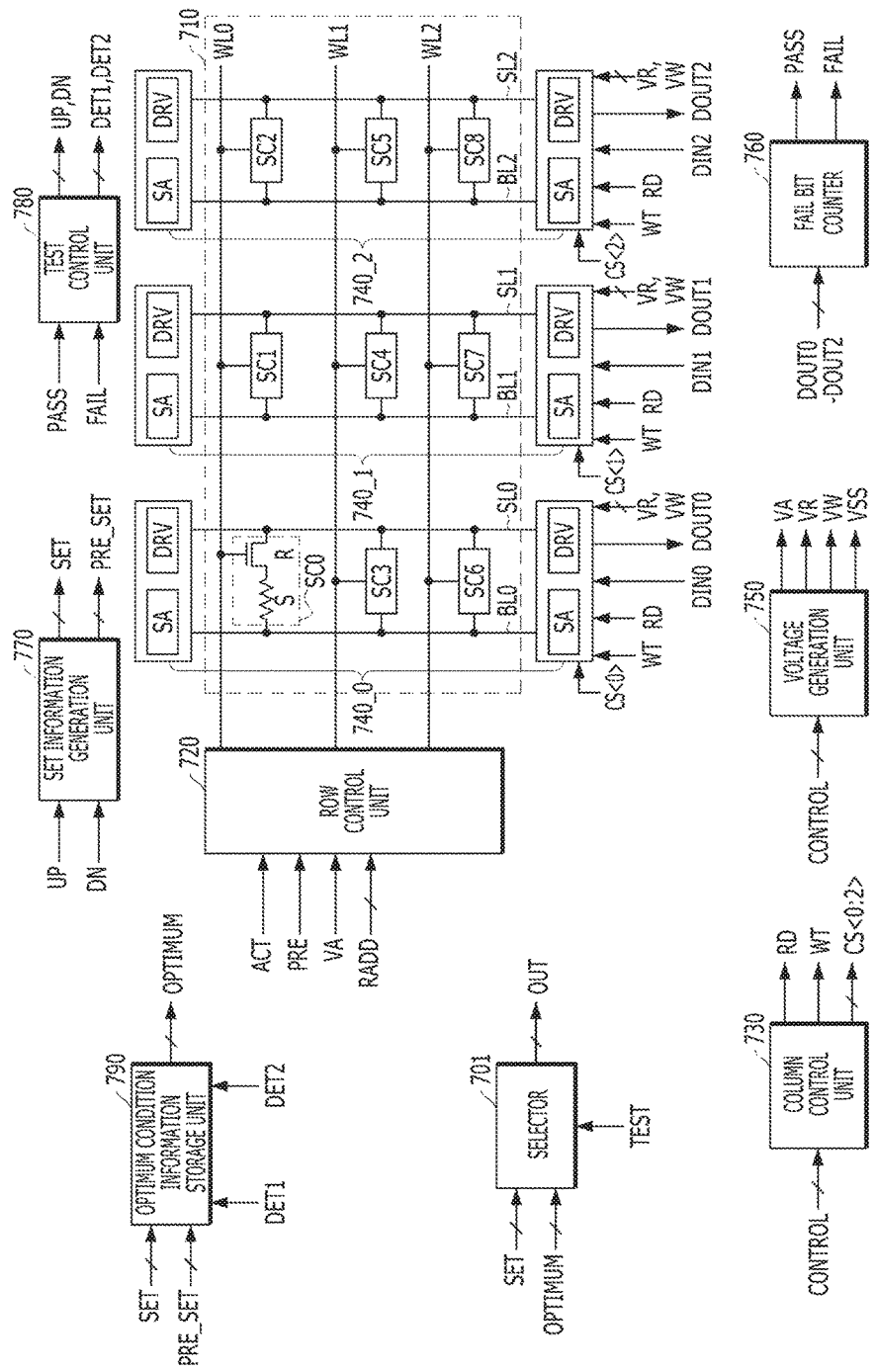
FIG. 7 is an exemplary configuration diagram of a memory circuit (device) including variable resistance elements.

FIG. 7 is an exemplary configuration diagram of a memory circuit (device) including variable resistance elements.

Referring to FIG. 7, the memory circuit (device) may include a cell array 710, a row control unit 720, a column control unit 730, a plurality of access units 740_0 to 740_2, a voltage generation unit 750, a fail bit counter 760, a set information generation unit 770, a test control unit 780 and an optimum condition information storage unit 790.

The cell array 710 may include a plurality of resistive storage cells SC0 to SC2, a plurality of bit lines BL0 to BL2, a plurality of source lines SL0 to SL2 and a plurality of word lines WL0 to WL2. Each of the resistive storage cells SC0 to SC2 may be coupled between the corresponding bit line and the corresponding source line, and coupled to the corresponding word line.

Each of the resistive storage cells SC may include a variable resistance element R and a selecting element S coupled in series to the variable resistance element R. The variable resistance element R may have a low resistance state when 'low' data (for example, 0) is stored therein, or have a high resistance state when 'high' data (for example, 1) is stored therein. On the other hand, the variable resistance element R may have a low resistance state when 'high' data is stored therein, or have a high resistance state when 'low' data are stored therein. FIG. 7 illustrates the internal configuration for the resistive storage cell SC0 only for convenience of illustration. However, other resistive storage cells SC1 to SC8 may have the same internal configuration as the resistive storage cell SC0.

For reference, FIG. 7 illustrates that the cell array 710 includes resistive storage cells arranged in a 3×3 matrix. In some implementations, the cell array 710 may include resistive storage cells arranged in various manners including dozens to tens of thousands of rows and columns.

The row control unit 720 may drive (activate) a word line corresponding to a row address RADD with an active voltage VA when an active signal ACT is enabled, and precharge the activated word line when a precharge signal PRE is enabled. The active signal ACT and the precharge signal PRE may be enabled in response to an active command and a precharge command, respectively.

The column control unit 730 may enable a read signal RD during a preset period while a read operation is performed. The column control unit 730 may enable a write signal WT by a period corresponding to control information CONTROL, during a write operation. That is, the column control unit 730 may increase or decrease the period in which the write signal WT is enabled, according to the value of the control information CONTROL. The column control unit 730 may enable a column select signal corresponding to a column address CADD among a plurality of column select signals CS<0:2>.

Each of the access units 740_0 to 740_2 may be coupled to the corresponding bit line among the plurality of bit lines BL0 to BL2 and the corresponding source line among the plurality of source lines SL0 to SL2. Each of the access units 740_0 to 740_2 may apply a read voltage VR to one end of the corresponding bit line and apply a ground voltage VSS to one end of the corresponding source line during the period in which the read signal RD is enabled, thereby sensing data of a selected resistive storage cell. The access unit corresponding to the enabled column select signal may output the sensed data. Furthermore, each of the access units 740_0 to 740_2 may apply the write voltage VW to the corresponding bit line or the corresponding source line and apply the ground voltage VSS to the corresponding bit line or the corresponding source line, according to data to be written, during the period in which the write signal WT is enabled.

For this operation, each of the access units 740_0 to 740_2 may include a sensing unit SA and a driving unit DRV. The sensing unit SA may drive the corresponding bit line and the corresponding source line to sense data during a read operation, and the driving unit DRV may drive the corresponding bit line and the corresponding source line during a write operation.

For reference, DATA_OUT may represent data sensed in a selected resistive storage cell during a read operation, and DATA_IN may represent data to be written to a selected resistive storage cell during a read operation.

The voltage generation unit 750 may generate various voltages VA, VW, VR and VSS which are used for an active operation, a read operation and a write operation. The voltage generation unit 750 may adjust the levels of one or more of the active voltage VA and the write voltage VW in response to the control information CONTROL. More specifically, the voltage generation unit 750 may raise or lower the level of the active voltage VA in response to the control information CONTROL. Alternatively, the voltage generation unit 750 may raise or lower the level of the write voltage VW in response to the control information CONTROL. Alternatively, the voltage generation unit 750 may raise or lower the levels of the active voltage VA and the write voltage VW in response to the control information CONTROL.

For reference, the control information CONTROL may be set to set information SET during a test operation in which a signal TEST is enabled, and set to optimum condition information OPTIMUM during a normal operation in which the signal TEST is disabled. When the signal TEST is enabled, a selector 701 may select the set information SET and output the selected information as the control information CONTROL, and when the signal TEST is disabled, the selector 701 may select the optimum condition information OPTIMUM and output the selected information as the control information CONTROL.

During a test operation, the fail bit counter 760 may count the number of resistive storage cells among the plurality of resistive storage cells SC0 to SC8, in which data as desired is not written. Depending on the number of fail bits during a test operation, the fail bit counter 760 may determine whether the write operation was normally operated. When the number of fail bits exceeds a preset reference value, the fail bit counter 760 may determine the write operation as a fail and enable a signal FAIL, and when the number of fail bits is equal to or less than the reference value, the fail bit counter 760 may determine the write operation as a pass, and enable a signal PASS.

The set information generation unit 770 may generate set information SET for controlling the amount and pulse width of the write current IW during a test operation. The set information generation unit 770 may generate set information SET corresponding to the initial condition at the first test cycle. Then, when a signal UP is enabled, the set information generation unit 770 may update the set information SET to correspond to a set condition which is strengthened from the set condition of the previous test cycle, and when a signal DN is enabled, the set information generation unit 770 may update the set information SET to correspond to a set condition which is eased from the set condition of the previous test cycle. The set information generation unit 770 may store and output the set information of the previous test cycle at test cycles after the first test cycle.

The test control unit 780 may control the set information generation unit 770 according to the determination result of the fail bit counter 760, and enable a detection signal DET1 or DET2 when the determination result of the fail bit counter 760 is changed from a fail to a pass or changed from a pass to a fail. The test control unit 780 may enable the signal UP when the fail bit counter 760 determines the write operation as a fail, and enable the signal DN when the fail bit counter 760 determines the write operation as a pass.

The test control unit 780 may enable the first detection signal DET1 when the determination result of the fail bit counter 760 is a fail at the previous test cycle and the determination result of the fail bit counter 760 is a pass at the current test cycle. On the other hand, the test control unit 780 may enable the second detection signal DET2 when the determination result of the fail bit counter 760 is a pass at the previous test cycle and the determination result of the fail bit counter 760 is a fail at the current test cycle.

When set information corresponding to the optimum condition is detected according to the test result, the optimum condition information storage unit 790 may store the set information as the optimum condition information OPTIMUM. The optimum condition information storage unit 790 may store the set information SET of the current test cycle as the optimum condition information OPTIMUM when the first detection signal DET1 is enabled, and store the set information PRE_SET of the previous test cycle as the optimum condition information OPTIMUM when the second detection signal DET2 is enabled. The optimum condition information OPTIMUM may be used to determine the amount and pulse width of the write current IW during a normal operation.

The optimum condition information storage unit 790 may include one of nonvolatile memory circuits such as a fuse circuit, ROM (Read Only Memory), NOR Flash Memory, NAND Flash Memory, PRAM (Phase Change Random Access Memory), RRAM (Resistive Random Access Memory), STTRAM (Spin Transfer Torque Random Access Memory) or MRAM (Magnetic Random Access Memory) or one of various circuits which store data by performing a similar function to the nonvolatile memory circuit.

Hereafter, the test operation of the memory circuit (device) will be described based on the above-described configuration.

At the first test cycle, the memory circuit may write data to the plurality of resistive storage cells SC0 to SC8 using a write current IW of which the amount and pulse width correspond to the initial condition. The fail bit counter 760 may determine whether the write operation is a pass/fail, according to the number of fail bits. The reset operation is performed by writing the opposite data to the data currently written in the resistive storage cells SC0 to SC8. Before the starting of the next test cycle, when the write operation is determined as a fail, the signal UP may be enabled to strengthen the set condition, and when the write operation is determined as a pass, the signal DN may be enabled to ease the set condition.

At the second cycle, the memory circuit may write data to the plurality of resistive storage cells SC0 to SC8 using a write current IW of which the amount and/or pulse width have been adjusted, i.e., strengthened or eased, depending on the determination of the pass/fail determination step of the first testy cycle. Then, the fail bit counter 760 may determine whether the write operation of the second cycle is a pass or a fail. When the pass/fail determination result is equal to the pass/fail determination result of the previous test cycle, the set condition may be strengthened or eased before the next test cycle. When the pass/fail determination result is different from the pass/fail determination result of the previous test cycle, the set information SET of the current test cycle may be stored as the optimum condition information OPTIMUM in case where the determination for the first cycle was a fail but the determination for the second cycle was changed to a pass, and the set information SET of the previous test cycle may be stored as the optimum condition information OPTIMUM in case where the determination for the first cycle was a pass but the determination for the second cycle was changed to a fail.

For the subsequent cycles, the memory circuit repeat operations including the pass/fail determination, the reset operation and the condition change operation. For the pass/fail determination of each subsequent cycle, the determination for the current cycle and the determination for the previous cycle right before the current cycle The method for controlling the pulse width of the write current IW according to the set condition SET may be performed by controlling the period in which the write signal WT is enabled. Furthermore, the method for controlling the amount of the write current IW according to the set information SET may include various methods, for example, (1) controlling only the level of the write voltage VW, (2) controlling only the level of the active voltage VA, and (3) controlling the levels of the active voltage VA and the write voltage VW.

Furthermore, the method for strengthening or easing the set condition may include various methods, for example, (1) controlling the amount of the write current IW; (2) controlling only the pulse width of the write current IW; and (3) controlling both of the amount and pulse width of the write current IW.

For reference, the components 720, 730, 740_0 to 740_2 and 750 which are in charge of generating the write current IW and controlling the amount and pulse width of the write current IW in the memory circuit (device) may be referred to as a write current generation unit.

Figure 8:
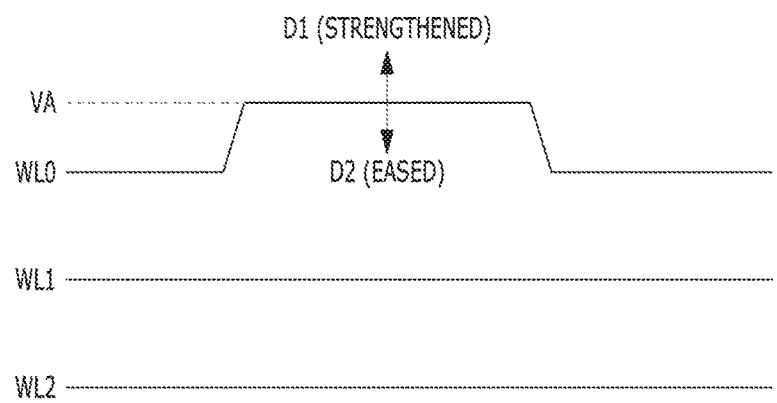
FIG. 8 is a diagram illustrating how an active voltage of a word line is controlled according to a change of set condition.

FIG. 8 is a diagram illustrating how the active voltage VA of a word line is controlled according to a change of the set condition SET.

Referring to FIG. 8, when the active signal ACT is enabled, a word line corresponding to the row address RADD (for example, WL0) may be enabled, and when the precharge signal PRE is enabled, the activated word line may be precharged. At this time, as the set condition is strengthened, the level of the active voltage VA may be gradually raised (D1), and as the set condition is eased, the level of the active voltage VA may be gradually lowered (D2).

Figure 9:
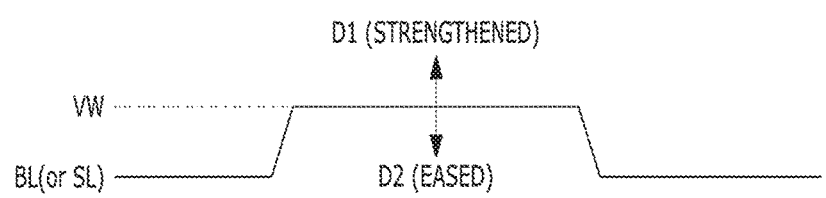
FIG. 9 is a diagram illustrating how a write voltage of a bit line or source line is controlled according to a change of the set condition.

FIG. 9 is a diagram illustrating how the write voltage VW of a bit line or source line is controlled according to a change of the set condition SET.

Referring to FIG. 9, the write voltage VW may be applied to the bit line or source line during a period in which the write signal WT is enabled. At this time, as the set condition is strengthened, the level of the write voltage VW may be gradually raised (D1), and as the set condition is eased, the level of the write voltage VW may be gradually lowered (D2).

Figure 10:
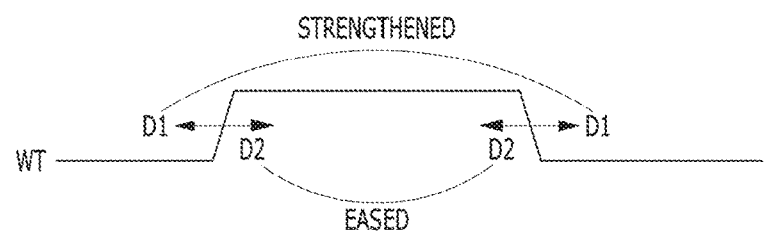
FIG. 10 is a diagram illustrating how the pulse width of a bit line or source line is controlled according to a change of the set condition.

FIG. 10 is a diagram illustrating how the pulse width of the bit line or source line is controlled according to a change of the set condition SET.

Referring to FIG. 10, the active period of the write signal WT may be adjusted according to the set condition SET. At this time, as the set condition is strengthened, the active period of the write signal WT may be gradually widened (D1), and as the set condition is eased, the active period of the write signal WT may be gradually narrowed.

In accordance with the embodiments, the electronic device and the operating method thereof can detect and store information on a write current of which the margin and reliability is maximized through a test, and increase a margin and reliability using the optimized write current during a write operation.

The memory circuit or the semiconductor device as described above may be used in various devices or systems. Some of devices or systems which may be implemented with the memory circuit or the semiconductor device as described above are illustrated in FIGS. 11 to 15.

Figure 11:
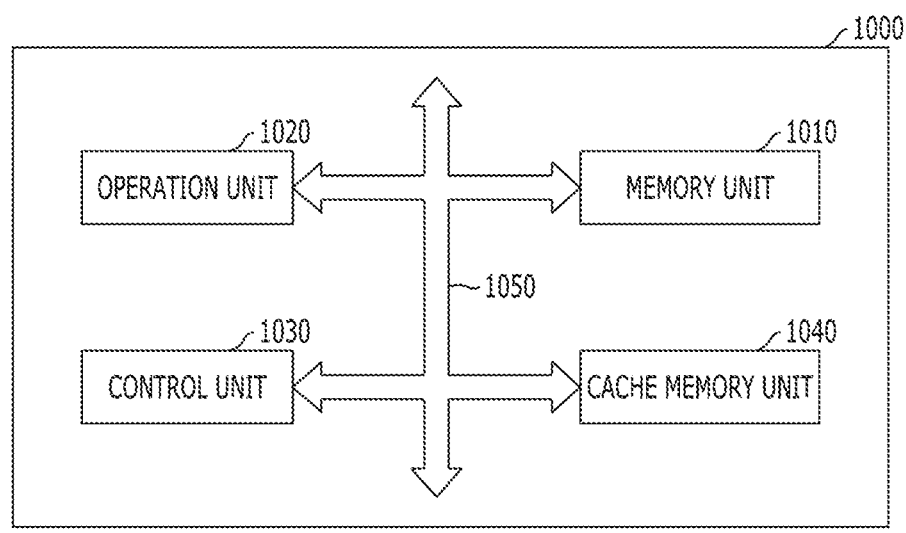
FIG. 11 is a configuration diagram illustrating an example of a microprocessor which is implemented with a memory device in accordance with an embodiment.

FIG. 11 is a configuration diagram illustrating an example of a microprocessor which is implemented with a memory device in accordance with an embodiment.

Referring to FIG. 11, a microprocessor 1000 may control and adjust a series of processes which receives data from various external devices, processes the data, and then sends a result to the external devices. The microprocessor 1000 may include a storage unit 1010, an operation unit 1020, a control unit 1030 and so on. The microprocessor 1000 may be various data processing devices such as a central processing unit (CPU), a graphic processing unit (GPU), a digital signal processor (DSP), an application processor (AP) and so on.

The storage unit 1010 may be a processor register, a register and so on, and be a part for storing the data in the microprocessor 1000. The storage unit 1010 may include a data register, an address register, a floating-point register, other various registers and so on. The storage unit 1010 may serve to temporarily store the data for performing an operation, the operation result data in the operation unit 1020, and an address in which the data is stored to be performed.

The storage unit 1010 may include one or more of the embodiments of the memory device as described above. For example, the storage unit 1010 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the storage unit 1010 may be increased by optimizing the write operation and a consumption current of the storage unit 1010 may be reduced. Consequently, a performance of the microprocessor 1000 may be improved.

The operation unit 1020 may perform a number of arithmetic and logical operations according to a result of decoding a command by the control unit 1030. The operation unit 1020 may include one or more arithmetic and logic units (ALU) and so on.

The control unit 1030 may receive a signal from the storage unit 1010, the operation unit 1020, an external device of the microprocessor 1000 and so on, and perform extraction or decode of the command, signal input/output control of the microprocessor 1000 and execute the processing which is represented by the program.

The microprocessor 1000 in accordance with the embodiment may further include a cache memory unit 1040 which may temporarily store data to be output to the external device or is input from the external device in addition to the storage unit 1010. The cache memory unit 1040 may exchange the data with the storage unit 1010, the operation unit 1020 and the control unit 1030 through a bus interface 1050.

Figure 12:
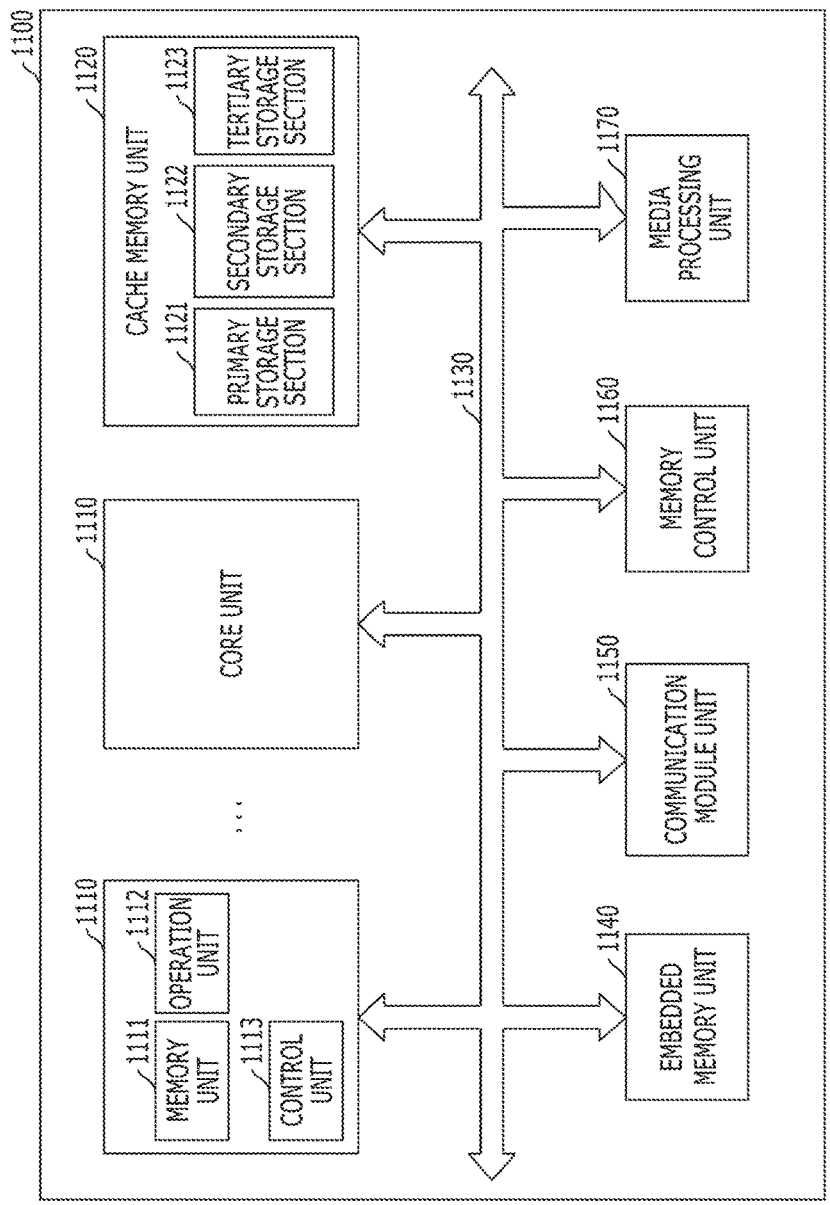
FIG. 12 is a configuration diagram illustrating an example of a processor which is implemented with a memory device in accordance with an embodiment.

FIG. 12 is a configuration diagram illustrating an example of a processor which is implemented with a memory device in accordance with an embodiment.

Referring to FIG. 12, a processor 1100 may improve performance and implement multi functions by including various functions in addition to a function of the microprocessor that control and adjust a series of processes which receives data from various external devices, processes the data, and then sends a result to the external devices. The processor 1100 may include a core unit 1110 serving as the microprocessor, a cache memory unit 1120 for temporarily storing data and a bus interface 1130 for transferring the data between an internal device and the external device. The processor 1100 may include a variety of system on chips (SoC) such as a multi core processor, a graphic processing unit (GPU), an application processor (AP) and so on.

The core unit 1110 may be a part for arithmetic and logic operating data input from the external device, and may include a storage unit 1111, an operation unit 1112 and a control unit 1113.

The storage unit 1111 may be a processor register, a register and so on, and be a part for storing the data in the processor 1100. The storage unit 1111 may include a data register, an address register, a floating-point register, other various registers and so on. The storage unit 1111 may serve to temporarily store the data for performing an operation, the operation result data in the operation unit 1112, and an address in which the data is stored to be performed. The operation unit 1112 is a part of performing the operation within the processor 1100, and may perform a number of arithmetic and logical operations according to a result of decoding a command by the control unit 1113. The operation unit 1112 may include one or more arithmetic and logic units (ALU) and so on. The control unit 1113 may receive a signal from the storage unit 1111, the operation unit 1112, the external device of the processor 1100 and so on, and perform extraction or decode of the command, signal input/output control of the processor 1111 and execute the processing which is represented by the program.

The cache memory unit 1120 is a part of temporarily storing data to compensate the data processing speed difference between the core unit 1110 which operates at high speed and the external device which operates at low speed. The cache memory unit 1120 may include a primary storage unit 1121, a secondary storage unit 1122, and a tertiary storage unit 1123. Generally, the cache memory unit 1120 may include the primary storage unit 1121 and the secondary storage unit 1122, and when high capacity is needed, the cache memory unit 1120 may include the third storage unit 1123. The cache memory unit 1120 may include more storage units as required. That is, the number of storage units which is included in the cache memory may depend on the design. The speeds for storing and determining data in the primary, the secondary and the tertiary storage units 1121, 1122 and 1123 may be the same as each other or be different from each other. When processing speeds of the storage units are different, a speed of the primary storage unit may be fastest. One or more storage units among the primary storage unit 1121, the secondary storage unit 1122 and the tertiary storage unit 1123 of the cache memory unit 1120 may include one or more of the embodiments of the memory devices as described above. For example, the cache memory unit 1120 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the cache memory unit 1120 may be increased by optimizing the write operation and a consumption current of the cache memory unit 1120 may be reduced. Consequently, a performance the processor 1100 may be improved.

FIG. 12 is the configuration diagram illustrating all of the primary, the secondary and the tertiary storage units 1121, 1122 and 1123 are configured within the cache memory unit 1120. However, all of the primary, the secondary and the tertiary storage units 1121, 1122 and 1123 of the cache memory unit 1120 are configured in the outside of the core unit 1110, and the processing speed difference may be compensated between the core unit 1110 and the external device. Also, the primary storage unit 1121 of the cache memory unit 1120 may be configured within the core unit 1110, and the secondary and the tertiary storage units 1122 and 1123 may be configured in the outside of the core unit 1110, and the complementary function of the processing speed difference may be enhanced. Also, the primary and the secondary storage units 1121 and 1122 may be configured within the core unit 1110, and the tertiary storage unit 1123 may be configured in the outside of the core unit 1110.

The bus interface 1130 is a part which allows data to be efficiently transmitted by coupling the core unit 1110, the cache memory unit 1120 and the external device.

The processor 1100 may include a plurality of the core units 1110, and the plurality of the core units 1110 may share the cache memory unit 1120. The plurality of the core units 1110 and the cache memory unit 1120 may be coupled directly, or may be coupled through the bus interface 1130. All of the plurality of the core units 1110 may have the same configuration as the core unit as described above. When the processor 1100 includes the plurality of the core units 1110, the primary storage unit 1121 of the cache memory unit 1120 may correspond to the number of a plurality of the core units 1110 and the primary storage unit 1121 may be configured in each of the core unit 1110, and the secondary and the tertiary storage units 1122 and 1123 may be configured in the outsides of the plurality of the core units 1110 to be shared through the bus interface 1130. Herein, the processing speed of the primary storage unit 1121 may be faster than the processing speeds of the secondary and the tertiary storage units 1122 and 1123. In the other embodiment, the primary storage unit 1121 and the secondary storage units 1122 may correspond to the number of the plurality of the core units 1110, and may be configured in each of the core unit 1110, the tertiary storage unit 1123 may be configured to be shared through the interface in the outsides of the plurality of the core units 1110.

The processor 1100 may further include an embedded memory unit 1140 for storing data, a communication module unit 1150 for sending and receiving the data with the external device in a wired or wireless manner, a memory control unit 1160 for driving an external storage device, a media processing unit 1170 for processing data processed in the processor 1100 or data input from an external input device and outputting the processed data to the external interface device and so on, and may further include a plurality of modules and devices. The plurality of the modules which are added may exchange the data with the core unit 1110 and the cache memory unit 1120 through the bus interface 1130.

The embedded memory unit 1140 may include a nonvolatile memory as well as a volatile memory. The volatile memory may include a dynamic random access memory (DRAM), a mobile DRAM, a static random access memory (SRAM) and a memory for performing a function similar thereto, and the non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM) and the memory for performing the function similar thereto.

The communication module unit 1150 may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) and so on as like various devices for sending and receiving the data without a transmission line.

The memory control unit 1160 may process and manage the data which is transmitted between the processor 1100 and the external storage device which operates according to a different communication standard from the processor 1100, and include various controllers for controlling memory controllers such as an integrated device electronics (IDE), a serial advanced technology attachment (SATA), a small computer system interface (SCSI), a redundant array of independent disks (RAID), a solid state disk (SSD), an external SATA (eSATA), a personal computer memory card international association (PCMCIA), an universal serial bus (USB), a secure digital card (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The media processing unit 1170 may process the data which is processed in the processor 1100 or which is input in a video, an audio, and other forms from the external input device, and output the data to the external interface device. The media processing unit 1170 may include a graphics processing unit (GPU), a digital signal processor (DSP), a high definition audio (HD Audio), a high definition multimedia interface (HDMI) controller and so on.

Figure 13:
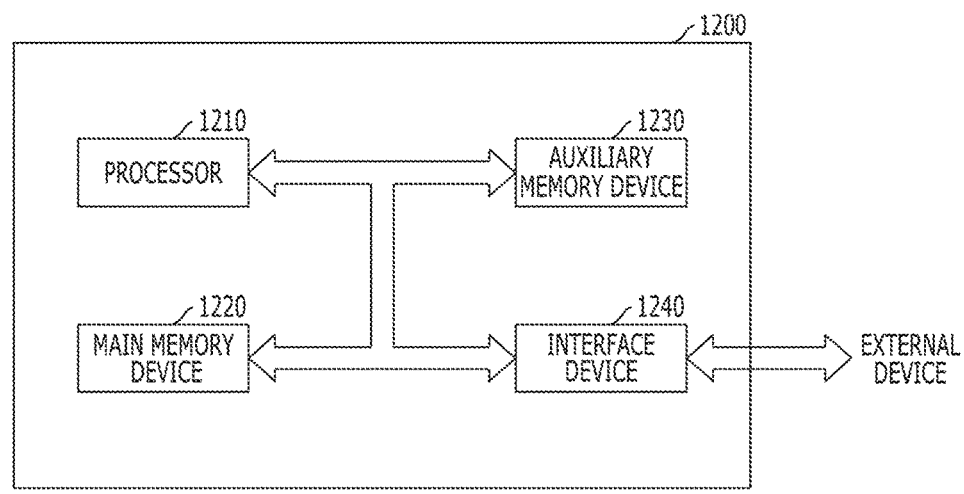
FIG. 13 is a configuration diagram illustrating an example of a system which is implemented with a memory device in accordance with an embodiment.

FIG. 13 is a configuration diagram illustrating an example of a system which is implemented with a memory device in accordance with an embodiment.

Referring to FIG. 13, a system 1200 is a device for processing data, and may perform input, processing, output, communication, storage and so on the data for performing a series of operations. The system 1200 may include a processor 1210, a main memory device 1220, an auxiliary memory device 1230, an interface device 1240 and so on. The system 1200 may be various electronic systems which operate using a process such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, a telematics, an audio visual system, a smart television and so on.

The processor 1210 may control processing such as interpretation of an input command, operation and comparison of the data stored in the system 1200 and so on. The processor 1210 may include a micro processor unit (MPU), a central processing unit (CPU), a single/multi core processor, a graphic processing unit (GPU), an application processor (AP), a digital signal processor (DSP) and so on.

The main memory device 1220 may be a memory device which imports a program code or data from the auxiliary memory device 1230, and stores and execute the program code or the data when the program is performed. Contents which are stored in the main memory device 1220 may be retained when power is interrupted. The main memory device 1220 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the main memory device 1220 may be increased by optimizing the write operation and a consumption current of the main memory device 1220 may be reduced. Consequently, a performance the system 1200 may be improved.

The main memory device 1220 may further include a volatile memory which contents are entirely erased when the power is interrupted, such as a static random access memory (SRAM), a dynamic random access memory (DRAM) and so on. On the other hand, the main memory device 1220 may not include the embodiments of the memory devices as described above, and may include the volatile memory which contents are entirely erased when the power is interrupted, such as the static random access memory (SRAM), the dynamic random access memory (DRAM) and so on.

The auxiliary memory device 1230 may be a memory device for storing data and a program code. A speed of the auxiliary memory device 1230 is slower than the speed of the main memory device 1220, but the auxiliary memory device 1230 may store a lot of data. The auxiliary memory device 1230 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the auxiliary memory device 1230 may be increased by optimizing the write operation and a consumption current of the auxiliary memory device 1230 may be reduced. Consequently, a performance of the system 1200 may be improved.

The auxiliary memory device 1230 may further include a data storage system such as a magnetic tape and a magnetic disk using magnetism, a laser disk using light, a magnetic-optical disk using the light and the magnetism, a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on. On the other hand, the auxiliary memory device 1230 may not include the embodiments of the memory devices as described above, and may include the data storage system such as the magnetic tape and the magnetic disk using magnetism, the laser disk using light, the magnetic-optical disk using the light and the magnetism, the solid state disk (SSD), the universal serial bus memory (USBM), the secure digital (SD), the mini secure digital card (mSD), the micro (SD), the secure digital high capacity (SDHC), the memory stick card, the smart media card (SM), the multi media card (MMC), the embedded MMC (eMMC), the compact flash (CF) and so on.

The interface device 1240 may exchange a command, data and so on between the system 1200 and the external device, and be a keypad, a keyboard, a mouse, a speaker, a mike, a display, a human interface device (HID), a communication device and so on. The communication device may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) as like various devices for sending and receiving the data without a transmission line.

Figure 14:
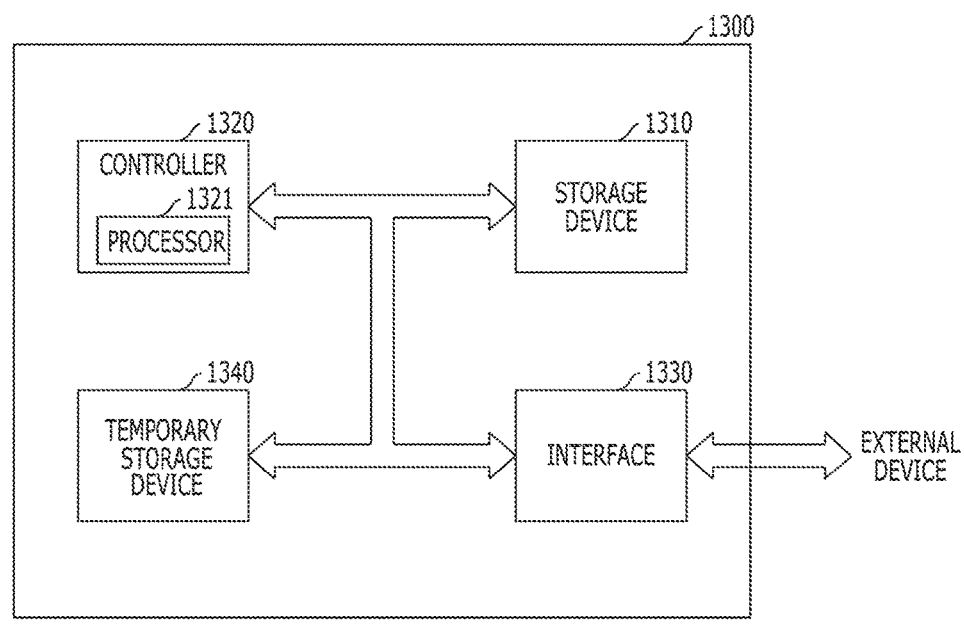
FIG. 14 is a configuration diagram illustrating an example of a data storage system which is implemented with a memory device in accordance with an embodiment.

FIG. 14 is a configuration diagram illustrating an example of a data storage system which is implemented with a memory device in accordance with an embodiment.

Referring to FIG. 14, a data storage system 1300 may include a storage device 1310 for storing data and having a non-volatile characteristic, a controller 1320 for controlling the storage device, an interface 1330 for coupling to an external device and a temporary storage device 1340 for temporarily storing data. The data storage system 1300 may be a disk type such as a hard disk drive (HDD), a compact disc read only memory (CDROM), a digital versatile disc (DVD), a solid state disk (SSD) and so on, and be a card type such as an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The storage device 1310 may include a non-volatile memory which semi-permanently stores data. The non-volatile memory may include a read only memory (ROM), a NOR flash memory, a NAND flash memory, a phase change random access memory (PRAM), a resistive random access memory (RRAM), magnetic random access memory (MRAM) and so on.

The controller 1320 may control exchange of data between the storage device 1310 and the interface 1330. The controller 1320 may include a processor 1321 which performs an operation and so on for processing commands which are input through the interface 1330 from the outside of the data storage system 1300.

The interface 1330 may exchange a command, data and so on between the data storage system 1300 and the external device. When the data storage system 1300 may be the card type, the interface 1330 may be compatible with interfaces which are used in a device such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. When the data storage system 1300 may be the disk type, the interface 1330 may be compatible with the interfaces such as an integrated device electronics (IDE), a serial advanced technology attachment (SATA), a small computer system interface (SCSI), an external SATA (eSATA), a personal computer memory card international association (PCMCIA), an universal serial bus (USB) and so on, or be compatible with interfaces which are used in the device similar thereto. The interface 1330 may be compatible with one or more interfaces which have different types.

The temporary storage device 1340 may temporarily store data to efficiently transfer the data between the interface 1330 and the storage device 1310 according to diversification and high performance of an interface with the external device, the controller, the system. The temporary storage device 1340 may include one or more of the embodiments of the memory devices as described above. For example, the temporary storage device 1340 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the temporary storage device 1340 may be increased by optimizing the write operation and a consumption current of the temporary storage device 1340 may be reduced. Consequently, a performance of the data storage system 1300 may be improved.

Figure 15:
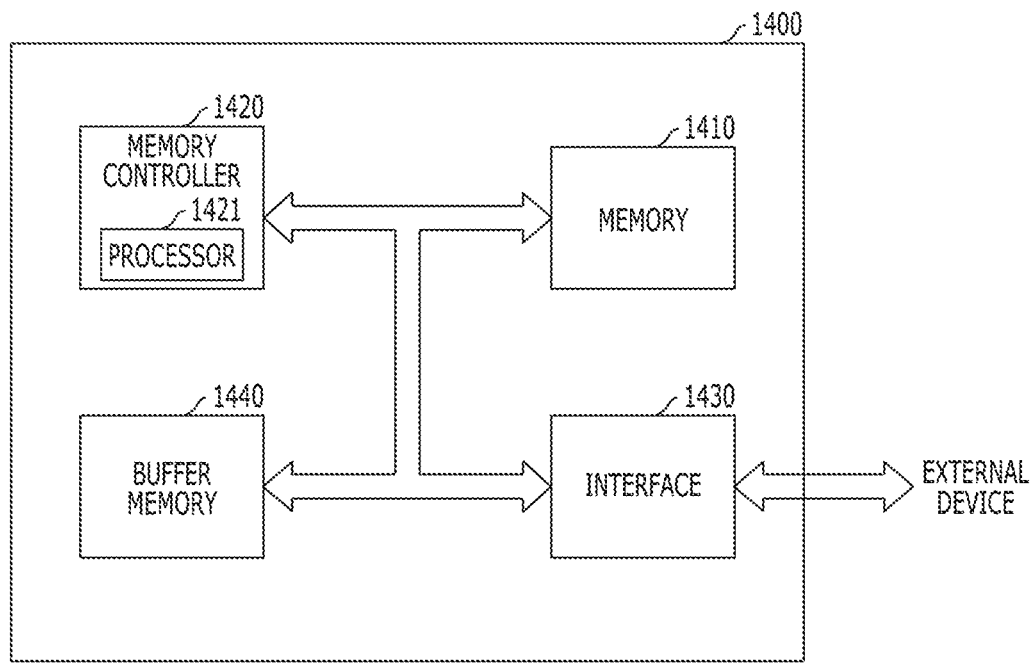
FIG. 15 is a configuration diagram illustrating an example of a memory system which is implemented with a memory device in accordance with an embodiment.

FIG. 15 is a configuration diagram illustrating an example of a memory system which is implemented with a memory device in accordance with an embodiment.

Referring to FIG. 15, a memory system 1400 may include a memory 1410 for storing data and having a non-volatile characteristic, a memory controller 1420 for controlling the memory, and an interface 1430 for coupling to an external device. The memory system 1400 may be a card type such as a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The memory 1410 may include one or more of the embodiments of the memory devices as described above. For example, the memory 1410 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the memory 1410 may be increased by optimizing the write operation and a consumption current of the memory 1410 may be reduced. Consequently, a performance of the memory system 1400 may be improved.

The memory may include a read only memory (ROM), a NOR flash memory, a NAND flash memory, a phase change random access memory (PRAM), a resistive random access memory (RRAM), a magnetic random access memory (MRAM) and so on having a non-volatile characteristic.

The memory controller 1420 may control exchange of data between the memory 1410 and the interface 1430. The memory controller 1420 may include a processor 1421 which performs an operation and so on for processing commands which are input through the interface 1430 from the outside of the memory system 1400.

The interface 1430 may exchange a command, data and so on between the memory system 1400 and the external device. The interface 1430 may be compatible with interfaces which are used in a device such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. The interface 1430 may be compatible with one or more interfaces which have different types.

The memory system 1400 may further include a buffer memory 1440 to efficiently transfer an input and an output of the data between the interface 1430 and the memory 1410 according to diversification and high performance of an interface with the external device, the memory controller, the memory system. The buffer memory 1440 which temporarily stores data may include one or more of the embodiments of the memory devices as described above. For example, The buffer memory 1440 may include a plurality of resistive storage cells; a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value; a set information generation unit configured to generate set information corresponding to a set condition, and update the set information to strengthen the set condition when the determination result is the fail or update the set information to ease the set condition when the determination result is the pass; and a write current generation unit configured to control the pulse width or amount of a write current flowing through a resistive storage cell which is written among the plurality of resistive storage cells, according to the set condition. Through this, a margin of the buffer memory 1440 may be increased by optimizing the write operation and a consumption current of the buffer memory 1440 may be reduced. Consequently, a performance of the memory system 1400 may be improved.

The buffer memory 1440 may include a static random access memory (SRAM) and a dynamic random access memory (DRAM) having a volatile characteristic, and include a read only memory (ROM), a NOR Flash Memory, a NAND Flash Memory, a phase change random access memory (PRAM), a resistive random access memory (RRAM), a spin transfer torque random access memory (STTRAM), a magnetic random access memory (MRAM) and so on having a non-volatile characteristic. On the other hand, the buffer memory 1440 may not include the embodiment of the memory devices as described above, and may include the static random access memory (SRAM), the dynamic random access memory (DRAM) having the volatile characteristic, and include the read only memory (ROM), the NOR Flash Memory, the NAND Flash Memory, the phase change random access memory (PRAM), the resistive random access memory (RRAM), the spin transfer torque random access memory (STTRAM), the magnetic random access memory (MRAM) and so on having the non-volatile characteristic.

The characteristic of the electronic device or system in FIGS. 11 to 15 may be implemented with various devices, a system, or an application. For example, a mobile phone or other portable communication device, a tablet computer, a notebook or laptop computer, a game machine, a smart TV set, a TV set-top box, a multi media server, a digital camera having a wired and wireless communication function, a wristwatch or other wearing device having a wireless communication function.

Although various embodiments have been described, it will be apparent to those skilled in the art that various changes and modifications may be made.

What is claimed is:

1. An electronic device comprising a semiconductor memory,
   wherein the semiconductor memory comprises:
   a plurality of resistive storage cells, each operable to store data and to receive a writing current to write data;
   a fail bit counter configured to count the number of resistive storage cells in which data are not normally written, among the plurality of resistive storage cells, and determine a write operation as a fail when the count value exceeds a reference value or determine the write operation as a pass when the count value is equal to or less than the reference value;
   a set information generation unit configured to generate set information corresponding to a set condition, and update the set information to strengthen the set condition when the determination result is the fail or update the set information to ease the set condition when the determination result is the pass; and
   a write current generation unit configured to control a pulse width or an amount of a write current flowing through a resistive storage cell among the plurality of resistive storage cells, according to the set condition,
   wherein the electronic device further comprises an optimum condition storage unit configured to store the set information corresponding to the set condition of a current write operation as optimum condition information, when the previous write operation is determined as the fail and the current write operation is determined as the pass, and store the set information corresponding to the set condition of the previous write operation as the optimum condition information, when the previous write operation is determined as the pass and the current write operation is determined as the fail.

2. The electronic device of claim 1, wherein the set information generation unit stores the set information corresponding to the set condition of the previous write operation, until the current write operation is completed.

3. The electronic device of claim 1, wherein the write current generation unit generates a write current using the optimum condition information stored in the optimum condition storage unit, in order to perform a write operation.

4. The electronic device of claim 1, wherein as the set condition is strengthened, the write current generation unit increases the pulse width of the write current, increases the amount of the write current, or increases the pulse width and amount of the write current.

5. The electronic device of claim 1, wherein as the set condition is strengthened, the write current generation unit increases a value corresponding to the product of the pulse width and the current amount.

6. The electronic device of claim 1, wherein as the set condition is eased, the write current generation unit decreases the pulse width of the write current, decreases the amount of the write current, or decreases the pulse width and amount of the write current.

7. The electronic device of claim 1, wherein as the set condition is eased, the write current generation unit decreases a value corresponding to the product of the pulse width and the current amount.

8. The electronic device of claim 1, wherein the semiconductor memory further comprises:
one or more bit lines each coupled to one end of a corresponding resistive storage cell among the plurality of resistive storage cells;
one or more source lines each coupled to the other end of a corresponding resistive storage cell among the plurality of resistive storage cells; and
one or more word lines each coupled to a corresponding resistive storage cell among the plurality of resistive storage cells.

9. The electronic device of claim 8, wherein the write current generation unit increases the period in which a write voltage is applied between the one or more bit lines and source lines when the pulse width of the write current is increased, and decreases the period in which the write voltage is applied between the one or more bit lines and source lines when the pulse width of the write current is decreased.

10. The electronic device of claim 8, wherein when the amount of the write current is increased, the write current generation unit raises the level of a write voltage applied between the one or more bit lines and source lines, raises the level of an active voltage applied to the word line, or raises the level of the write voltage and the level of the active voltage.

11. The electronic device of claim 8, wherein when the amount of the write current is decreased, the write current generation unit lowers the level of a write voltage applied between the one or more bit lines and source lines, lowers the level of an active voltage applied to the word line, or lowers the level of the write voltage and the level of the active voltage.

12. The electronic device of claim 1, wherein the variable resistance element comprises one or more of structures each having a tunnel barrier layer interposed between two magnetic layers.

13. The electronic device of claim 1, further comprising a microprocessor,
wherein the microprocessor comprising:
an access control unit suitable for receiving a signal having a command from an outside of the microprocessor, extracting or decoding the command, or performing input/output control of the signal of the microprocessor;
an operation unit suitable for performing an operation according to a decoding result of the command in the access control unit; and
a storage unit suitable for storing data to be operated, data corresponding to an operation result, or an address of the data to be operated, and
wherein the semiconductor memory is a part of the storage unit within the microprocessor.

14. The electronic device of claim 1, further comprising a processor,
wherein the processor comprising:
a core unit suitable for performing an operation corresponding to a command using data according to the command input from an outside of the processor; a cache memory unit suitable for storing data to be operated, data corresponding to an operation result, or an address of the data to be operated; and
a bus interface which is coupled between the core unit and the cache memory unit, and transfers data between the core unit and the cache memory unit, and
wherein the semiconductor memory is a part of the cache memory unit within the processor.

15. The electronic device of claim 1, further comprising a processing system, and
wherein the processing system comprising:
a processor suitable for interpreting a received command, and controlling an operation of information according to an interpreting result of the command;
an auxiliary memory device suitable for storing a program for interpreting the command and the information;
a main memory device suitable for importing and storing the program and the information from the auxiliary memory device such that the processor performs the operation using the program and the information when the program is executed; and
an interface device suitable for performing communication between one or more of the processor, the auxiliary memory device and the main memory device and an outside, and
wherein the semiconductor memory is a part of the auxiliary memory device or the main memory device within the processing system.

16. The electronic device of claim 1, further comprising a data storage system,
wherein the data storage system comprising:
a storage device suitable for storing data and retaining the stored data regardless of a power supply;
a controller suitable for controlling data input/output of the storage device according to a command input from an outside;
a temporary storage device suitable for temporarily storing the data which is exchanged between the storage device and the outside; and
an interface suitable for performing communication between one or more of the storage device, the controller and the temporary storage device and the outside, and
wherein the semiconductor memory is a part of the storage device or the temporary storage device within the data storage system.

17. The electronic device of claim 1, further comprising a memory system,
wherein the memory system comprising:
a memory suitable for storing data and retaining the stored data regardless of a power supply;

a memory controller suitable for controlling data input/output of the memory according to a command input from an outside;
a buffer memory suitable for buffering the data which is exchanged between the memory and the outside; and
an interface suitable for performing communication between one or more of the memory, the memory controller and the buffer memory and the outside, and
wherein, the semiconductor memory is a part of the memory or the buffer memory within the memory system.

* * * * *